US012555523B2

(12) United States Patent
Wang

(10) Patent No.: US 12,555,523 B2
(45) Date of Patent: Feb. 17, 2026

(54) PIXEL DRIVING CIRCUIT AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Cheng Wang, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 19/069,482

(22) Filed: Mar. 4, 2025

(65) Prior Publication Data

US 2025/0201183 A1 Jun. 19, 2025

Related U.S. Application Data

(63) Continuation of application No. 18/567,904, filed as application No. PCT/CN2023/131921 on Nov. 14, 2023, now Pat. No. 12,300,159.

(30) Foreign Application Priority Data

Nov. 14, 2023 (CN) ........................ 202311520096.X

(51) Int. Cl.
*G09G 3/32* (2016.01)
*H10K 59/121* (2023.01)

(52) U.S. Cl.
CPC ........... *G09G 3/32* (2013.01); *H10K 59/1216* (2023.02); *G09G 2300/0426* (2013.01);
(Continued)

(58) Field of Classification Search
CPC ............. G09G 3/32; G09G 2300/0426; G09G 2300/0852; G09G 2310/08;
(Continued)

(56) References Cited

U.S. PATENT DOCUMENTS

2014/0184481 A1 7/2014 Kim et al.
2018/0308427 A1* 10/2018 Zhang ................ H10K 59/1216
(Continued)

FOREIGN PATENT DOCUMENTS

CN 205541822 U 8/2016
CN 107230457 A 10/2017
(Continued)

OTHER PUBLICATIONS

Chinese Office Action issued in corresponding Chinese Patent Application No. 202311520096.X dated Jan. 15, 2025, pp. 1-12.
(Continued)

*Primary Examiner* — Pegeman Karimi
(74) *Attorney, Agent, or Firm* — Geoffrey Lottenberg; Berger Singerman LLP

(57) ABSTRACT

An embodiment of the present disclosure is directed to a pixel driving circuit and a display panel. In the pixel driving circuit and display panel, a first capacitor is added between the first initial signal line of the first reset circuit and the second initial signal line of the second reset circuit.

20 Claims, 4 Drawing Sheets

(52) U.S. Cl.
CPC . *G09G 2300/0852* (2013.01); *G09G 2310/08* (2013.01); *G09G 2320/0233* (2013.01); *G09G 2320/045* (2013.01)

(58) Field of Classification Search
CPC ..... G09G 2320/0233; G09G 2320/045; G09G 3/3233; H10K 59/1216
See application file for complete search history.

(56) References Cited

U.S. PATENT DOCUMENTS

| | | | | |
|---|---|---|---|---|
| 2023/0140104 A1* | 5/2023 | Zhang | G09G 3/3266 | 345/204 |
| 2024/0169925 A1* | 5/2024 | Yuan | G11C 19/287 | |
| 2024/0265862 A1* | 8/2024 | Xu | G09G 3/3208 | |

FOREIGN PATENT DOCUMENTS

| | | | |
|---|---|---|---|
| CN | 108538907 | A | 9/2018 |
| CN | 109524447 | A | 3/2019 |
| CN | 113496673 | A | 10/2021 |
| CN | 113674693 | A | 11/2021 |
| CN | 114241970 | A | 3/2022 |
| CN | 114495835 | A | 5/2022 |
| CN | 115023756 | A | 9/2022 |
| CN | 115377125 | A | 11/2022 |
| CN | 115691426 | A | 2/2023 |
| CN | 115775536 | A | 3/2023 |
| CN | 116114009 | A | 5/2023 |
| CN | 116895234 | A | 10/2023 |
| CN | 117456891 | B | 4/2025 |
| KR | 20220091348 | A | 6/2022 |
| WO | 2022257057 | A1 | 12/2022 |
| WO | 2023004810 | A1 | 2/2023 |

OTHER PUBLICATIONS

International Search Report in International application No. PCT/CN2023/131921, mailed on Aug. 13, 2024.
International Written Opinion in International application No. PCT/CN2023/131921, mailed on Aug. 13, 2024.
Chinese Office Action issued in corresponding Chinese Patent Application No. 202510315020.6 dated Sep. 13, 2025, pp. 1-6.
Acta Physica Sinca vol. 65, Issue 2 Dec. 15, 2015 High speed gate driver circuit basd on metal oxide thin film transistors Zhang, Lirong, Etc.

* cited by examiner

PIXEL DRIVING CIRCUIT AND DISPLAY PANEL

CROSS-REFERENCE TO RELATED APPLICATIONS

This application is a continuation application of U.S. application Ser. No. 18/567,904, filed on Dec. 7, 2023, which is a National Phase of PCT Patent Application No. PCT/CN2023/131921 having international filling date of Nov. 16, 2023, which claims the priority of Chinese Application No. 202311520096.X filed with the Chinese Patent Office on Nov. 14, 2023 and titled "PIXEL DRIVING CIRCUIT AND DISPLAY PANEL", which is incorporated herein by reference in its entirety.

FIELD OF THE DISCLOSURE

The present disclosure relates to a display technology, and more particularly, to a pixel driving circuit and a display panel.

BACKGROUND

In the conventional Low Temperature Poly-Oxide (LTPO) thin-film transistor driver products, pixel driving circuits with 8 thin-film transistors (8T) pixel driver are widely used. However, when the 8T LTPO product is in a low gray value, the screen might have bright and dark lines and thus the display quality is affected.

SUMMARY

One objective of an embodiment of the present disclosure is to provide a pixel driving circuit and a display panel to alleviate the risks of showing bright and dark lines.

According to an embodiment of the present disclosure, a pixel driving circuit is disclosed. The pixel driving circuit comprises:

- a first transistor, configured as a driving transistor, having a gate connected to a first node, a first electrode connected to a second node, and a second electrode connected to a third node.
- a data writing circuit, connected to the second node, configured to write a data signal into the second node in response to a first gate driving signal.
- a threshold compensation circuit, connected to the first node and the third node, configured to connect the first node to the third node in response to a second gate driving signal.
- a first reset circuit, connected to the first node and a first initial signal line, configured to transmit a signal of the first initial signal line to the first node in response to a first reset signal.
- a control circuit, connected to a first power supply terminal, the second node, the third node and a fourth node, configured to transmit a signal of the first power supply terminal to the second node in response to an enabling signal and connect the third node to the fourth node in response to the enabling signal.
- a second reset circuit, connected to the fourth node and a second initial signal line, configured to transmit a signal of the second initial signal line to the fourth node in response to a second reset signal.
- a first capacitor, connected between the first initial signal line and the second initial signal line; and
- a light-emitting device, having an anode connected to the fourth node.

According to an embodiment of the present disclosure, a display panel is disclosed. The display panel comprises the above-mentioned pixel driving circuit.

DETAILED DESCRIPTION OF PREFERRED EMBODIMENTS

Figure 1:
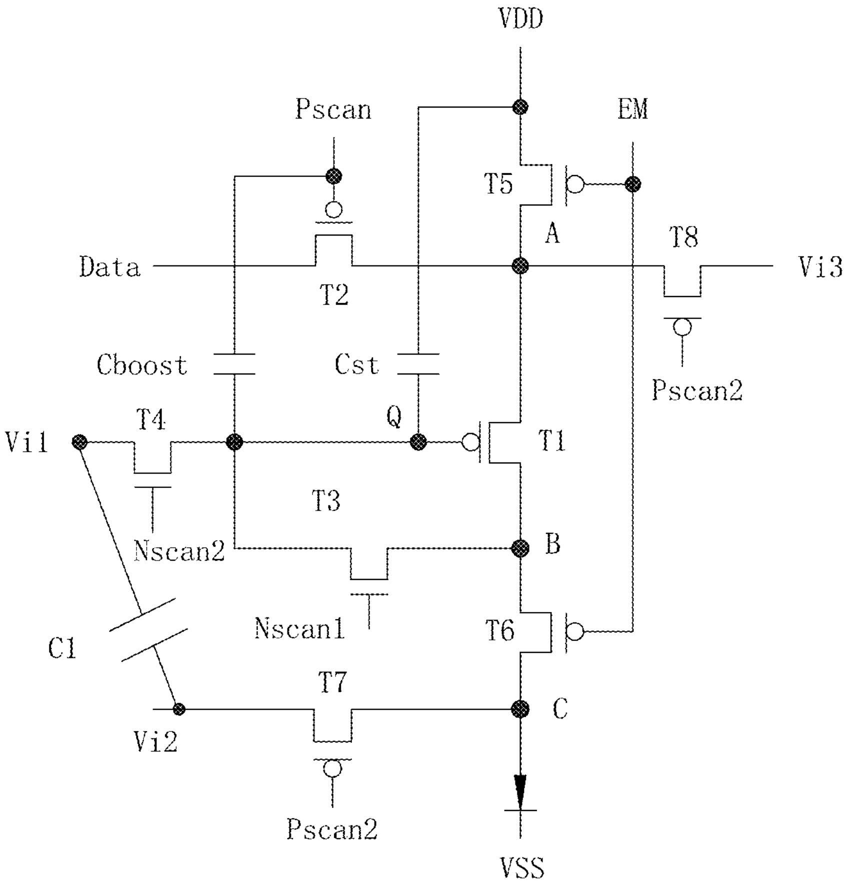
FIG. 1 is an equivalent circuit diagram of a pixel driving circuit according to an embodiment of the present disclosure.

Specifically, the terminologies in the embodiments of the present disclosure are merely for describing the purpose of the certain embodiment, but not to limit the disclosure. Examples and the appended claims be implemented in the present disclosure requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

The technical solutions in the embodiments of the present disclosure will be clearly and completely described below with reference to the accompanying drawings in the embodiments of the present disclosure. Obviously, the described embodiments are only some of the embodiments of the present disclosure, rather than all of the embodiments. Based on the embodiments in this application, all other embodiments obtained by those skilled in the art without making creative efforts fall within the scope of protection of this application. In addition, it should be understood that the specific embodiments described here are only used to illustrate and explain the application, and are not used to limit the application. In this application, unless otherwise specified, the directional words used such as "upper" and "lower" usually refer to the upper and lower positions of the device in actual use or working conditions, specifically the direction of the drawing in the drawings. The terms "Inside" and "outside" refer to the outline of the device. The terms "first", "second", "third", are only used as labels and do not impose numerical requirements or establish an order.

One skilled in in the art can understand that the transistors used in all embodiments of the present disclosure may be thin film transistors, field effect transistors, or other devices with the same characteristics. In this specification, the first electrode may be a drain and the second electrode may be a source, or the first electrode may be a source and the second electrode may be a drain. When transistors with opposite polarities are used or when the current direction changes during circuit operation, the functions of the "source" and the "drain" may be interchanged with each other. Therefore, in this specification, "source" and "drain" may be interchanged with each other.

According to an embodiment of the present disclosure, a pixel driving circuit includes:

- a first transistor, configured as a driving transistor, having a gate connected to a first node, a first electrode connected to a second node, and a second electrode connected to a third node.
- a data writing circuit, connected to the second node, configured to write a data signal into the second node in response to a first gate driving signal.
- a threshold compensation circuit, connected to the first node and the third node, configured to connect the first node to the third node in response to a second gate driving signal.
- a first reset circuit, connected to the first node and a first initial signal line, configured to transmit a signal of the first initial signal line to the first node in response to a first reset signal.
- a control circuit, connected to a first power supply terminal, the second node, the third node and a fourth node, configured to transmit a signal of the first power supply terminal to the second node in response to an enabling signal and connect the third node to the fourth node in response to the enabling signal.
- a second reset circuit, connected to the fourth node and a second initial signal line, configured to transmit a signal of the second initial signal line to the fourth node in response to a second reset signal.
- a first capacitor, connected between the first initial signal line and the second initial signal line; and
- a light-emitting device, having an anode connected to the fourth node.

Optionally, in some embodiments of the present disclosure, the pixel driving circuit further comprises: a second capacitor, a third capacitor, and a third reset circuit. The second capacitor includes one end connected to the first node and a control end of the data writing circuit.

The third capacitor is connected between the first node and the first power supply terminal.

The third reset circuit is connected to the second node and a second power supply terminal, and is configured to input a signal of the second power supply end to the second node in response to the second reset signal.

Optionally, in some embodiments of the present disclosure, the data writing circuit comprises a second transistor, having a gate connected to the second capacitor and receiving the first gate driving signal, a first electrode receiving the data signal, and a second electrode connected to the second node.

The threshold compensation circuit comprises a third transistor, having a gate receiving the second gate driving signal, a first electrode connected to the first node, and a second electrode connected to the third node.

The first reset circuit comprises a fourth transistor, having a gate receiving the first reset signal, a first electrode connected to the first initial signal line, and a second electrode is connected to the first node.

The control circuit comprises: a fifth transistor, having a gate receiving the enable signal, a first electrode connected to the first power supply terminal, and a second electrode connected to the second node; and a sixth transistor, having a gate receiving the enabling signal, a first electrode connected to the third node, and a second electrode connected to the fourth node.

The second reset circuit comprises a seventh transistor, having a gate receiving the second reset signal, a first electrode connected to the second initial signal line, and a second electrode connected to the fourth node.

The third reset circuit comprises an eighth transistor, having a gate receiving the second reset signal, a first electrode connected to the second power supply terminal, and a second electrode connected to the second node.

Optionally, in some embodiments of the present disclosure, the first transistor, the second transistor, the fifth transistor, the sixth transistor, the seventh transistor and the eighth transistor are P-type low-temperature polycrystalline silicon transistors, and the third transistor and the fourth transistor are N-type oxide transistors.

Optionally, in some embodiments of the present disclosure, the capacitance of the first capacitor is greater than or equal to 14.4 fF.

Correspondingly, according to another embodiment of the present disclosure, a display panel includes a pixel driving circuit as provided above.

Optionally, in some embodiments of the present disclosure, the display panel further comprising: a substrate, a first insulating layer and a second insulating layer, The first initial signal line comprises a first section, the first capacitor comprises a first electrode plate and a second electrode plate, the first section is arranged on the substrate, the first insulating layer covers the first section, the first electrode plate is arranged on one side of the first insulating layer that is away from the substrate, the first section is connected to the first electrode plate, and the second insulating layer covers the first electrode plate.

The second initial signal line comprises a second section, the second section is connected to the second electrode plate and is arranged on one side of the second insulating layer that is away from the substrate in a same layer as the second electrode plate; the first electrode plate and the second electrode plate overlaps in a direction perpendicular to a surface of the display panel.

Optionally, in some embodiments of the present disclosure, the display panel further comprises: a data line receiving the data signal, The data line is arranged on one side of the second insulating layer away from the substrate, the data line and the second section partially overlap in the direction perpendicular to the surface of the display panel, the data line and the second section form a parasitic capacitor, and the first capacitance has a greater capacitance than the parasitic capacitor.

Optionally, in some embodiments of the present disclosure, the first capacitor further comprises a compensation plate formed by extending the first section in a direction of the first electrode plate, the compensation plate comprises a connected first part and a second part, wherein in an orthographic projection of the display panel, the first part respectively overlaps with the first electrode plate and the second electrode plate, the second part is located on an outer side of the first electrode plate, and the second part partially overlaps with the second electrode plate.

Optionally, in some embodiments of the present disclosure, a resistivity of the compensation plate is less than a resistivity of the first electrode plate.

Optionally, in some embodiments of the present disclosure, the first initial signal line further comprises an adapter section, a connecting section and a first input section, The adapter section and the second section are placed in a same layer with a space on the second insulating layer; the connecting section, the first input section, the first electrode plate are placed in a same layer on the first insulating layer; the connecting section is connected to the first electrode plate and the first input section; the first input section is connected to the first reset circuit; the second insulating layer has a first via and a second via; the first via passes through the first insulating layer and exposes the first section; the second via exposes the connecting section; and one end of the adapter section is connected to the first section through the first via, and another end of the adapter section is connected to the connecting section through the second via.

Optionally, in some embodiments of the present disclosure, an active layer of the connecting section, the first input section, the first electrode plate and the fourth transistor of the first reset circuit are located in a same layer, and materials of the active layers comprise metal oxide semiconductors.

The present disclosure discloses a pixel driving circuit and a display panel. In an embodiment, in the pixel drive circuit and the display panel, a first capacitor is added between the first initial signal line of the first reset circuit and the second initial signal line of the second reset circuit, so that the capacitance of the second initial signal line is increased and the anti-coupling ability is improved. When the fourth node is being reset, the coupling influence on the second initial signal line from the data line is reduced, thereby reducing the risk of the occurrence of bright and dark lines.

Please refer to FIG. 1. According to an embodiment of the present disclosure, a pixel driving circuit is disclosed. The pixel driving circuit comprises a first transistor T1, a data writing circuit D1, a threshold compensation circuit D2, a first reset circuit D3, a control circuit D4, a second reset circuit D5, a first capacitor C1 and a light-emitting device EL.

The first transistor T1 is a driving transistor. The gate of the first transistor T1 is connected to the first node Q, the first electrode of the first transistor T1 is connected to the second node A, and the second electrode of the first transistor T1 is connected to the third node B.

The data writing circuit D1 is connected to the second node A. The data writing circuit D1 is configured to write the data signal Data to the second node A in response to the first gate driving signal Pscan.

The threshold compensation circuit D2 is connected to the first node Q and the third node B. The threshold compensation circuit D2 is configured to connect the first node Q to the third node B in response to the second gate driving signal Nscan1.

The first reset circuit D3 is connected to the first node Q and the first initial signal line and is configured to transmit the signal Vi1 of the first initial signal line to the first node Q in response to the first reset signal Nscan2.

The control circuit D4 is connected to the first power supply terminal, the second node A, the third node B and the fourth node C. The control circuit D4 is configured to transmit the signal VDD of the first power supply terminal to the second node A in response to the enabling signal EM and is configured to connect the third node B to the fourth node C in response to to the enabling signal EM.

The second reset circuit D5 is connected to the fourth node C and the second initial signal line. The second reset circuit D5 is configured to transmit the signal Vi2 of the second initial signal line to the fourth node C in response to the second reset signal Pscan2.

One end of the first capacitor C1 is connected to the first initial signal line, and the other end of the first capacitor C1 is connected to the second initial signal line. The anode of the light-emitting device EL is connected to the fourth node C. The cathode of the light-emitting device EL is connected to the third power signal VSS.

In a conventional pixel driving circuit, there is a parasitic capacitor between the data line and the second initial signal line. When the data signal is in transition, the data signal has a coupling effect on the second initial signal line, the reset operation of the fourth node changes such that the bright and dark lines might occur. In an embodiment, in the pixel driving circuit, a first capacitor C1 is added between the first initial signal line of the first reset circuit D3 and the second initial signal line of the second reset circuit D5, so that the capacitance of the second initial signal line increases and the anti-coupling ability is improved. When the fourth node C is being reset, the coupling effect on the second initial signal line from the data line is reduced, thereby reducing the risk of the bright and dark lines occurrence.

Optionally, the light-emitting device EL can be a light-emitting diode. Writing the first initial signal Vi1 to the fourth node C can eliminate the carriers that do not have a composite at the light-emitting interface inside the light-emitting diode and alleviate the aging of the light-emitting diode.

Optionally, the pixel driving circuit also comprises a second capacitor Cboost, a third capacitor Cst, and a third reset circuit D6.

One end of the second capacitor Cboost is connected to the first node Q, and the other end of the first capacitor C1 is connected to the control end of the data writing circuit D1. One end of the third capacitor Cst is connected to the first node Q, and the other end of the third capacitor Cst is connected to the first power supply end.

The third reset circuit D6 is connected to the second node A and the second power supply. The third reset circuit D6 is configured to input the signal Vi3 of the second power supply terminal to the second node A in response to the second reset signal Pscan2.

The data writing circuit D1 comprises a second transistor T2. The gate of the second transistor T2 is connected to the second capacitor Cboost and is configured to receive the first gate driving signal Pscan. The first electrode of the second transistor T2 receives the data signal Data, and the second electrode of the second transistor T2 is connected to the second node A.

The threshold compensation circuit D2 comprises a third transistor T3. The gate of the third transistor T3 receives the second gate driving signal Nscan1, the first electrode of the third transistor T3 is connected to the first node Q, and the second electrode of the third transistor T3 is connected to the third node B.

The first reset circuit D3 comprises a fourth transistor T4. The gate of the fourth transistor T4 receives the first reset signal Nscan2, the first electrode of the fourth transistor T4 is connected to the first initial signal line, and the second electrode of the fourth transistor T4 is connected to the first node Q.

The control circuit D4 comprises a fifth transistor T5 and a sixth transistor T6. The gate of the fifth transistor T5 receives the enabling signal EM, the first electrode of the fifth transistor T5 is connected to the first power supply terminal, and the second electrode of the fifth transistor T5 is connected to the second node A. The gate of the sixth transistor T6 receives the enabling signal EM, the first electrode of the sixth transistor T6 is connected to the third node B, and the second electrode of the sixth transistor T6 is connected to the fourth node C.

The second reset circuit D5 comprises a seventh transistor T7. The gate of the seventh transistor T7 receives the second reset signal Pscan2, the first electrode of the seventh transistor T7 is connected to the second initial signal line, and the second electrode of the seventh transistor T7 is connected to the fourth node C.

The third reset circuit D6 comprises an eighth transistor T8. The gate of the eighth transistor T8 receives the second reset signal Pscan2, the first electrode of the eighth transistor T8 is connected to the second power supply terminal, and the second electrode of the eighth transistor T8 is connected to the second node A.

Optionally, the first transistor T1, the second transistor T2, the fifth transistor T5, the sixth transistor T6, the seventh transistor T7 and the eighth transistor T8 are P-type low-temperature polysilicon transistors. The third transistor T3 and the fourth transistor T4 are N-type oxide transistors.

The N-type metal oxide transistor has a small leakage current, which prevents the leakage current from flowing from the third node B through the third transistor T3 and the fourth transistor T4 in the light-emitting phase. The low-temperature polycrystalline silicon transistors have a higher carrier mobility, which is conducive to the realization of display panels with high resolution, high reaction speed, high pixel density, and high aperture ratio.

Optionally, in some embodiments of the present disclosure, the first transistor T1, the second transistor T2, the fifth transistor T5, the sixth transistor T6, the seventh transistor T7 and the eighth transistor T8 may also be N-type transistors, and the third transistor T3 and the fourth transistor T4 may also be P-type transistors. However, this arrangement is not a limitation of the present disclosure.

Optionally, in an embodiment, in the pixel driving circuit, the capacitance of the first capacitor C1 is greater than or equal to 14.4 fF. The larger the capacitance of the first capacitor C1, the better the anti-coupling effect of the second initial signal line and the lower the risk of occurrence of bright and dark lines.

According to the table below, when the capacitance of the first capacitor C1 reaches 14.4 fF, it can be fully optimized, and the coupling effect on the second initial signal line from the data line changes from 9.3% to 3%, and the product does not have bright and dark lines.

| Comparison items | Before optimization (without first capacitor C1) | After optimization (adding the first capacitor C1) | conclusion |
|---|---|---|---|
| The capacitance (fF) of the data line and the second initial signal line | 0.64 | 0.64 | Fully optimized |
| The total capacitance (fF) of the second initial signal line | 6.9 | 21.3 | |
| proportion | 9.3% | 3% | |

Optionally, the first capacitor C1 can be 14.4 fF, 14.5 fF, 14.6 fF, 14.7 fF, 14.8 fF, 14.9 fF, 15 fF, 15.1 fF, 15.2 fF, 15.3 fF, 15.4 fF, 15.5 fF, 15.6 fF, 15.7 fF, 15.8 fF, 15.9 fF, 16 fF, 16.1 fF, 16.2 fF, 16.3 fF, 16.4 fF, 16.5 fF, 16.6 fF, 16.7 fF, 16.8 fF, 16.9 fF, 17 fF, 17.5 fF, 18 fF, 18.5 fF, 19 fF, 19.5 fF, 20 fF, 21 fF, 22 fF, 23 fF, 24 fF, 25 fF, 26 fF, 27 fF, 28 fF, 29 fF, or 30 fF.

In some embodiments, the capacitance of the first capacitor C1 may also be less than 14.4 fF, for example may be 14 fF, 13 fF, 12 fF, 11 fF, 10 fF, 9 fF, 8 fF, 7 fF, 6 fF, 5 fF, 4 fF, 3 fF, 2 fF, or 1 fF.

It is noted that as long as the first capacitor C1 is added, the total capacitance of the second initial signal line can be increased, and the anti-coupling effect can be improved. When the capacitance of the first capacitor C1 reaches 14.4 fF, the issue of bright and dark lines could be avoided.

Optionally, the capacitance of the first capacitor C1 is greater than 0.64 fF, so that the second initial signal line can better resist the coupling effect of the data line.

Figure 2:
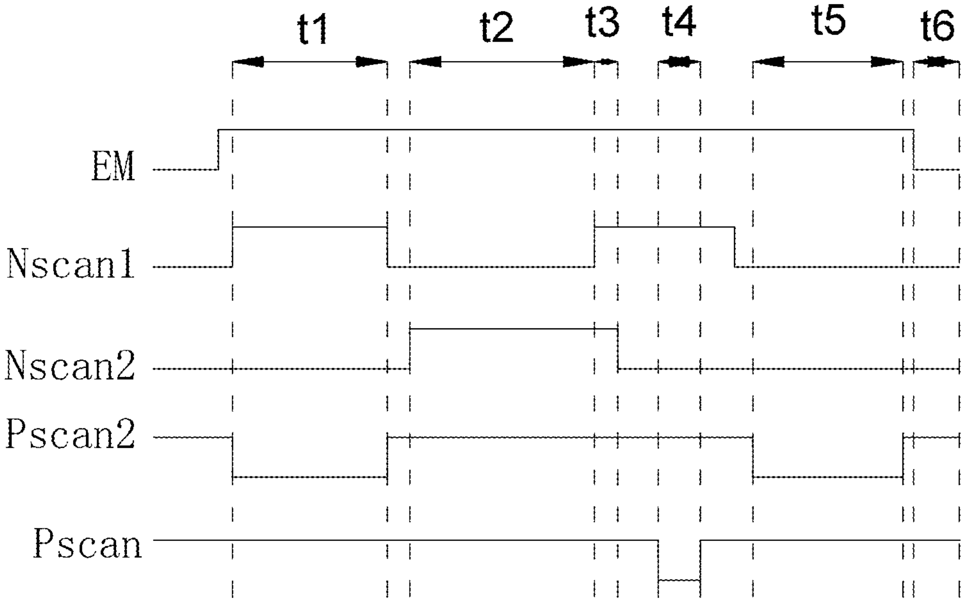
FIG. 2 is a timing diagram of the pixel drive circuit according to an embodiment of the present disclosure.

Please refer to FIG. 2. In this embodiment, the pixel driving circuit comprises six stages: the first stage T1, the second stage T2, the third stage T3, the fourth stage T4, the fifth stage T5 and the sixth stage T6.

In the first stage t1, the enable signal EM, the first gate driving signal Pscan, and the second gate driving signal Nscan 1 are in a high voltage level, and the first reset signal Nscan2 and the second reset signal Pscan2 are in a low voltage level. Accordingly, the first transistor T1, the third transistor T3, the seventh transistor T7, and the eighth transistor T8 are turned on, and the other transistors are turned off. The first power supply terminal inputs the signal Vi3 of the second power supply to the second node A, the third node B and the first node Q to perform a charging operation. The second initial signal line inputs the signal Vi2 of the second initial signal line to the fourth node C to perform a reset operation.

In the second stage t2, the enable signal EM, the first reset signal Nscan2, the second reset signal Pscan2 and the first gate driving signal Pscan are in a high voltage level, and the second gate driving signal Nscan1 is in a low voltage level. Accordingly, the fourth transistor T4 is turned on, and the other transistors are turned off. The first initial signal line inputs the signal Vi1 of the first initial signal line to the first node Q to perform a reset operation.

In the third stage t3, the enable signal EM, the second gate driving signal Nscan1, the first reset signal Nscan2, the second reset signal Pscan2, and the first gate driving signal Pscan are in a high voltage level. Accordingly, the first transistor T1, the third transistor T3, and the fourth transistor T4 are turned on, and the other transistors are turned off. The first initial signal line writes the signal Vi1 of the first initial signal line to the first node Q, the second node A and the third node B to perform a reset operation.

In the fourth stage t4, the enable signal EM, the second gate driving signal Nscan1 and the second reset signal Pscan2 are in a high voltage level, and the first gate driving signal Pscan and the first reset signal Nscan2 are in a low voltage level. Accordingly, the first transistor T1, the second transistor T2 and the third transistor T3 are turned on, and the other transistors are turned off. The data line writes the data signal Data to the first node Q.

In the fifth stage t5, the enable signal EM and the first gate driving signal Pscan are in a high voltage level, and the first reset signal Nscan 2, the second gate driving signal Nscan and the second reset signal Pscan2 are in a low voltage level. Accordingly, the first transistor T1, the second transistor T2 and the seventh transistor T7 are turned on. The first power supply input signals Vi3 of the second power supply to the second node A and the third node B to perform a charging operation. The second initial signal line inputs the signal Vi2 of the second initial signal line to the fourth node C to perform a reset operation.

In the sixth stage t6, the first gate driving signal Pscan and the second reset signal Pscan 2 are in a high voltage level, and the enable signal EM, the second gate drive signal Nscan1 and the first reset signal Nscan2 are in a low voltage level. Accordingly, the first transistor T1, the fifth transistor T5 and the sixth transistor T6 are turned on, and the other transistors are turned off. The light-emitting device EL emits light.

Correspondingly, according to an embodiment of the present disclosure, a display panel 100. The display panel 100 comprises a pixel driving circuit of any one of the above embodiments. That is, in this embodiment, the structure of the pixel driving circuit of the display panel 100 is similar or identical to the structure of the pixel driving circuit of any of the above embodiments.

In the conventional display panel with the 8T architecture, there is a parasitic capacitance between the data line and the second initial signal line. When the data signal is in transition, the data signal has a coupling effect on the second initial signal line, the reset operation of the fourth node changes such that the bright and dark lines might occur. In an embodiment, in the pixel driving circuit, a first capacitor C1 is added between the first initial signal line of the first reset circuit D3 and the second initial signal line of the second reset circuit D5, so that the capacitance of the second initial signal line increases and the anti-coupling ability is improved. When the fourth node C is being reset, the coupling effect on the second initial signal line from the data line is reduced, thereby reducing the risk of the bright and dark lines occurrence.

Figure 3:
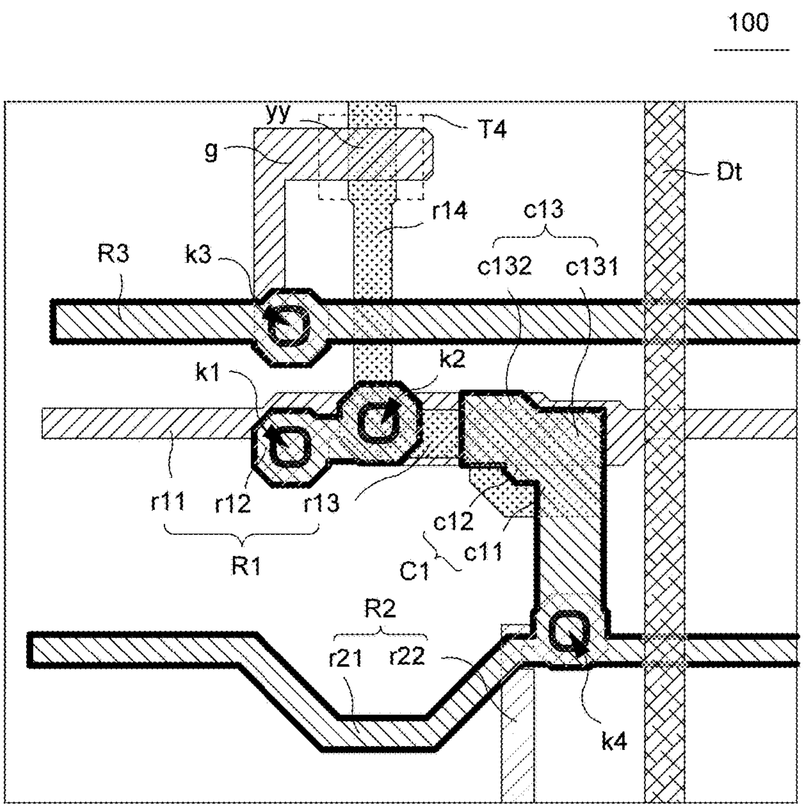
FIG. 3 is a diagram of a partial orthographic projection of a display panel according to an embodiment of the present disclosure.
Figure 4:
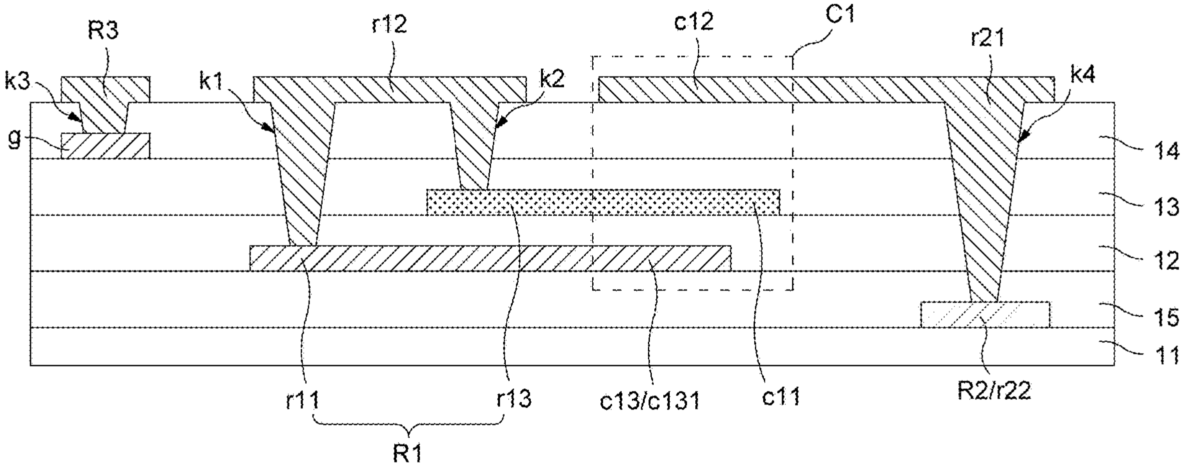
FIG. 4 is a diagram of a cross-sectional structure of the display panel according to an embodiment of the present disclosure.

Optionally, please refer to FIG. 3 and FIG. 4. The display panel 100 comprises a substrate 11, a first insulating layer 12 and a second insulating layer 13. The first initial signal line R1 comprises a first section r11. The first capacitor C1 comprises a first electrode plate c11 and a second electrode plate c12. The first section R11 is placed on the substrate 11. The first insulating layer 12 covers the first section R11. The first electrode plate c11 is arranged on one side of the first insulating layer 12 away from the substrate 11. The first section R11 is connected to the first plate C11. The second insulating layer 13 covers the first plate c11.

The second initial signal line R2 comprises a second section r21. The second section r21 is connected to the second electrode plate c12 and is arranged on one side of the second insulating layer 13, far away from the substrate 11, in the same layer as the second electrode plate c12. In the direction perpendicular to the surface of the display panel 100, the first electrode plate C11 and the second electrode plate C12 overlap.

The display panel 100 further comprises a data line Dt for receiving the data signal Data. The data line Dt is arranged on the side of the second insulating layer 13 away from the substrate 11. In the direction perpendicular to the surface of the display panel 100, the data line Dt and the second section r21 partially overlap. The data line Dt and the second section r21 form a parasitic capacitor, and the capacitance of the first capacitance C1 is greater than the parasitic capacitance.

The capacitance of the first capacitor C1 is larger than the parasitic capacitance, so that the second initial signal line R2 can better resist the coupling effect from the data line Dt.

Optionally, the data line Dt is connected to the first electrode of the second transistor T2.

Optionally, the first section r11, the second section r21, and the second electrode plate c12 can be made with metal elements selected from chromium, copper, aluminum, gold, silver, zinc, molybdenum, tantalum, titanium, tungsten, manganese, nickel, iron, and cobalt, or alloys composed of any of the above metal elements, or alloys combining any of the above metal elements. In addition, the first section r11, the second section r21, and the second electrode plate c12 can have a single-layer structure or a two-layer or more-layer stacked structure, such as layers of titanium/aluminum/titanium.

Figure 5:
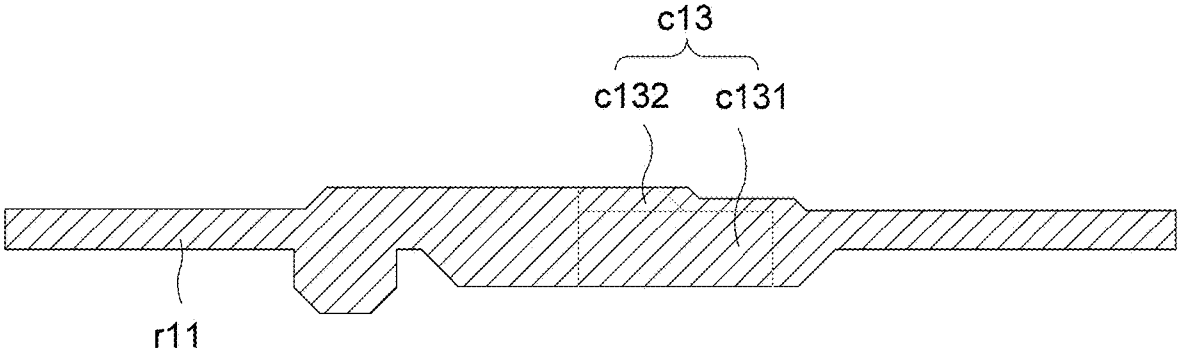
FIG. 5 is a diagram of an orthographic projection of the layer where the first section of the first initial signal line shown in FIG. 3 is located.

Optionally, please refer to FIG. 5. The first capacitor C1 further comprises a compensation plate C13 formed by extending the first section r11 in the direction of the first plate C11. The compensation plate C13 comprises a connected first part C131 and a second part C132. In the orthographic projection of the display panel 100, the first part c131 respectively overlaps with the first plate C11 and the second plate C12. The second part C132 is located on the outer side of the first plate C11, and the second part C132 partially overlaps with the second plate C12.

The compensation plate c13 and the first electrode plate c11 are connected to form a lower electrode plate. The second electrode plate c12 is an upper electrode plate. The upper electrode plate and the lower electrode plate overlap to form the first capacitor C1.

It is noted that the compensation plate c13 can increase the capacitance of the first capacitor C1.

The distance between the compensation plate C13 and the second electrode plate C12 is greater than the distance between the first electrode plate C11 and the second electrode plate C12. Then, the capacitance of the second part C132 of the compensation electrode plate c13 and the second plate C12 is lower than the capacitance of the first electrode plate C11 and the second electrode plate C12 per unit area. That is, by including the second part c132 of the compensation plate c13, the capacitance of the first capacitor C1 can be better adjusted and the idle space can be fully utilized.

Optionally, the resistivity of the compensation plate C13 is lower than the resistivity of the first electrode plate C11. That is, the resistivity of the first electrode plate C11 is higher, its conductivity is poor, and the voltage difference is larger. Therefore, the electric field strength formed by the first electrode plate C11 and the second electrode plate C12 is stronger, and the capacitance is larger.

The overlapping area of the first electrode plate c11 and the second electrode plate c12 is larger than the overlapping area of the second part c132 of the compensating plate c13 and the second plate c12, so that the first capacitor C1 with a larger capacitance can be formed in a limited space.

Figure 6:
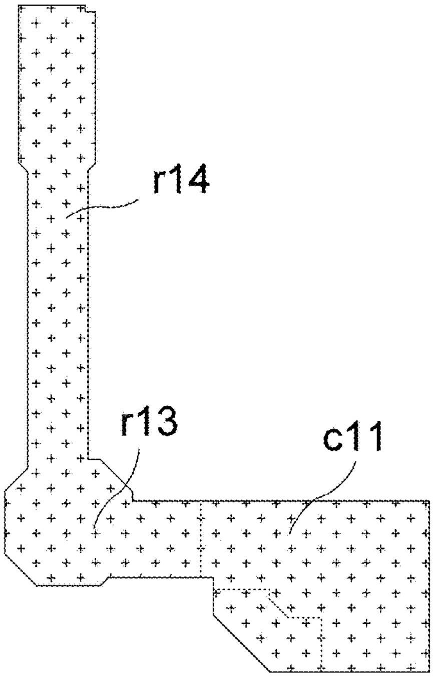
FIG. 6 is a diagram of an orthographic projection of the layer where the first electrode plate shown in FIG. 3 is located.
Figure 7:
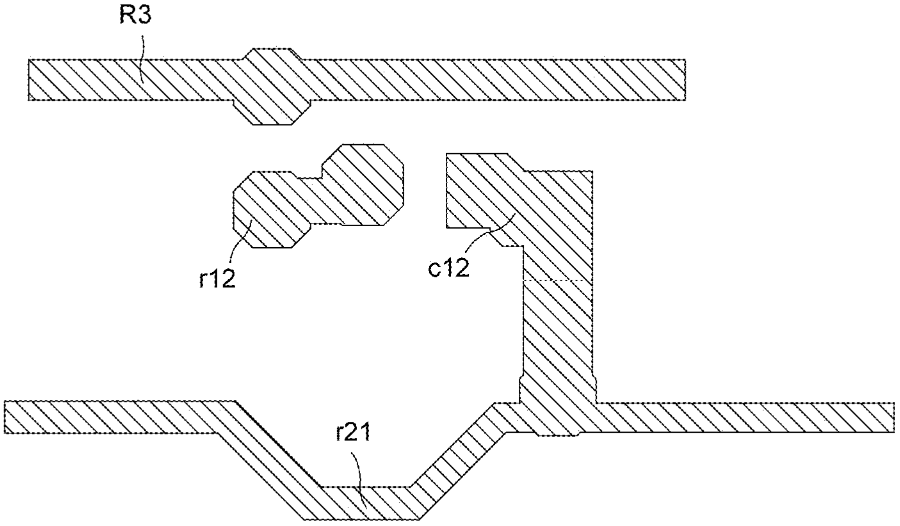
FIG. 7 is a diagram of an orthographic projection of the layer where the second section of the second initial signal line shown in FIG. 3 is located.

Optionally, please refer to FIG. 6 and FIG. 7. The first initial signal line R1 further comprises an adaptor section r12, a connection section r13 and a first input section r14. The adapter section r12 and the second section r21 are placed in a same layer with a space on the second insulating layer 13. The connection section R13, the first input section r14, and the first pole plate c11 are arranged in the same layer on the first insulating layer 12. The connection section r13 is connected to the first electrode plate c11 and the first input section r14. The first input section r14 is connected to the first reset circuit D3. The second insulating layer 13 has a first via k1 and a second via k2. The first via k1 passes through the first insulating layer 12 and exposes the first section r11, and the second via K2 exposes the connection section r13. One end of the adapter section r12 is connected to the first section r11 through the first via k1, and the other end of the adaptor section r12 is connected to the connection section r13 through the second via K2.

The first section r11 and the connection section r13 are connected by the transfer section r12 of the different layer, which can save the wiring space in the horizontal direction.

Optionally, the active layers yy of the connection section r13, the first input section r14, the first electrode plate c11 and the fourth transistor T4 of the first reset circuit D3 are arranged in the same layer, and the materials of the the connection section r13, the first input section r14, the first electrode plate c11 and the fourth transistor T4 include metal oxide semiconductors.

The active layers of the connection section r13, the first input section r14, the first electrode plate c11 and the fourth transistor T4 of the first reset circuit D3 can be made by the same lithography process, so that the capacitance of the first capacitor C1 can be increased with more simple manufacturing process.

Optionally, the fourth transistor T4 further comprises a gate g. The gate g is connected to the first reset signal line R3 through a third via k3. The first reset signal line R3 is arranged in the same layer as the second section r21 of the second initial signal line R2. The gate g and the first reset signal line R3 are arranged in different layers. The first and second electrodes of the fourth transistor T4 are integrally formed with the active layer yy.

The third insulating layer 14 is arranged between the gate g and the first reset signal line R3. The gate g is arranged on one side of the second insulating layer 13 far away from the substrate 11. The third insulating layer 14 covers the gate g and the second insulating layer 13. The first reset signal line R3 is arranged on the third insulating layer 14.

Optionally, the second section r21, the connection section r13, the second electrode plate c12 and the first reset signal line R3 can be made by the same lithography process, and the materials of the second section r21, the connection section r13, the second electrode plate c12 are the same.

Optionally, the second initial signal line R2 further comprises a second input section r22. The second input section r22 is arranged on the substrate 11. The second section r21 is connected to the second input section r22 through a fourth via k4. The second input section r22 is connected to the first electrode of the seventh transistor T7.

The second input section r22 is located in the same layer as the active layer of the seventh transistor T7. The material of the second input section r22 is polysilicon.

The fourth insulating layer 15 is arranged between the second input section r22 and the first section r11. The second input section r22 is arranged on the substrate 11. The fourth insulating layer 15 covers the second input section r22 and the substrate 11. The first section r11 and the compensation plate c13 are arranged on one side of the fourth insulating layer 15 away from the substrate 11.

Optionally, the active layers of the second input section r22 and the seventh transistor T7 are formed by the same lithography process, and the materials of the second input section r22 and the seventh transistor T7 are the same.

The above has introduced in detail a pixel driving circuit and a display panel provided by the embodiments of the present disclosure. This article uses specific examples to illustrate the principles and implementation methods of the present disclosure. The description of the above embodiments is only used to help understand the present disclosure. The application method and its core idea; at the same time, for those skilled in the art, there will be changes in the specific implementation and application scope based on the ideas of this application. In summary, the contents of this specification should not be understood as limitations on this application.

What is claimed is:

1. A pixel driving circuit, comprising:
- a driving control circuit, configured to regulate a current supplied to a light-emitting device based on a stored control voltage;
- a data writing circuit, coupled to a first node, configured to receive a data signal and store a corresponding voltage in the first node in response to a first gate driving signal;
- a threshold compensation circuit, coupled between the first node and a second node, configured to equalize a potential difference between the first node and the second node in response to a second gate driving signal;
- a reset circuit, configured to reset one or more nodes in the pixel driving circuit before a driving operation;
- a power modulation circuit, configured to selectively couple a first power supply signal to the second node and control a switching state of the driving control circuit in response to a control signal;
- a charge balancing circuit, coupled between at least two signal lines; and
- a capacitance stabilization circuit, connected between a first initial signal line and a second initial signal line.

2. The pixel driving circuit of claim 1, wherein the capacitance stabilization circuit comprises a first capacitor coupled between the first initial signal line and the second initial signal line.

3. The pixel driving circuit of claim 1, further comprising:
- a second capacitor, having one end coupled to the first node and a control terminal of the data writing circuit;
- a third capacitor, coupled between the first node and the first power supply signal; and
- a secondary reset circuit, configured to reset the second node by applying a second power supply signal in response to a reset control signal.

4. The pixel driving circuit of claim 3, wherein the data writing circuit comprises a data writing transistor, having a gate coupled to the second capacitor and receiving the first gate driving signal, a first electrode receiving the data signal, and a second electrode coupled to the first node.

5. The pixel driving circuit of claim 4, wherein the power modulation circuit comprises:
- a first power transistor, having a gate receiving an enabling signal, a first electrode coupled to the first power supply signal, and a second electrode coupled to the second node; and
- a second power transistor, having a gate receiving the enabling signal, a first electrode coupled to the second node, and a second electrode coupled to a third node.

6. The pixel driving circuit of claim 5, wherein the charge balancing circuit comprises a balancing transistor, having a gate receiving a balancing control signal, a first electrode coupled to the third node, and a second electrode coupled to a fourth node.

7. The pixel driving circuit of claim 6, wherein the threshold compensation circuit comprises a compensation transistor, having a gate receiving the second gate driving signal, a first electrode coupled to the first node, and a second electrode coupled to the second node.

8. The pixel driving circuit of claim 7, wherein the reset circuit comprises a reset transistor, having a gate receiving a reset signal, a first electrode coupled to the first initial signal line, and a second electrode coupled to the first node.

9. The pixel driving circuit of claim 8, wherein the data writing transistor, the first power transistor, the second power transistor, and the balancing transistor are P-type low-temperature polycrystalline silicon transistors; and
- the compensation transistor and the reset transistor are N-type oxide transistors.

10. The pixel driving circuit of claim 1, wherein a capacitance of the capacitance stabilization circuit is greater than 0.64 fF.

11. The pixel driving circuit of claim 1, wherein a capacitance of the capacitance stabilization circuit is at least 14.4 fF.

12. A display panel, comprising:
- a plurality of pixel driving circuits, wherein each of the pixel driving circuits is configured to drive an individual sub-pixel, wherein each of the pixel driving circuits comprises:
- a driving control circuit, configured to regulate a current supplied to a light-emitting device based on a stored control voltage;
- a data writing circuit, coupled to a first node, configured to receive a data signal and store a corresponding voltage in the first node in response to a first gate driving signal;
- a threshold compensation circuit, coupled between the first node and a second node, configured to equalize a potential difference between the first node and the second node in response to a second gate driving signal;
- a reset circuit, configured to reset one or more nodes in the pixel driving circuit before a driving operation;
- a power modulation circuit, configured to selectively couple a first power supply signal to the second node and control a switching state of the driving control circuit in response to a control signal;
- a charge balancing circuit, coupled between at least two signal lines; and
- a capacitance stabilization circuit, connected between a first initial signal line and a second initial signal line.

13. The display panel of claim 12, further comprising a substrate, a first insulating layer, and a second insulating layer, wherein:
- the capacitance stabilization circuit comprises a first electrode plate and a second electrode plate;
- the first electrode plate is disposed on the first insulating layer away from the substrate; and
- the second electrode plate is disposed on the second insulating layer in a layer parallel to the first electrode plate.

14. The display panel of claim 13, wherein the capacitance stabilization circuit further comprises a compensation plate extending from the first electrode plate.

15. The display panel of claim 14, wherein the compensation plate has a first portion overlapping with both the first electrode plate and the second electrode plate; and
- a second portion located outside the first electrode plate and partially overlapping with the second electrode plate.

16. The display panel of claim 14, wherein a distance between the compensation plate and the second electrode plate is greater than a distance between the first electrode plate and the second electrode plate.

17. The display panel of claim 14, wherein a resistivity of the compensation plate is lower than a resistivity of the first electrode plate.

18. The display panel of claim 14, wherein the first initial signal line comprises:
- an adapter section, a connecting section, and a first input section, wherein:
- the adapter section and a second section of the second initial signal line are disposed in a same layer with a space in the second insulating layer;
- the connecting section, the first input section, and the first electrode plate are disposed in a same layer on the first insulating layer; and
- the first input section is coupled to the reset circuit.

19. The display panel of claim 18, wherein a capacitance of the capacitance stabilization circuit is greater than a parasitic capacitance formed between the second initial signal line and a data line.

20. The display panel of claim 12, wherein a capacitance of the capacitance stabilization circuit is at least 14.4 fF.

* * * * *